US008000933B1

(12) United States Patent
Poeltl et al.

(10) Patent No.: US 8,000,933 B1
(45) Date of Patent: Aug. 16, 2011

(54) METHOD AND APPARATUS FOR SHOWING DATA REPRESENTATIVE OF THE ACCURACY OF OPERATIONS OF A HIGH-VOLTAGE SWITCHGEAR

(75) Inventors: Anton Poeltl, Hempfield, PA (US); Michael Mendik, Jeannette, PA (US)

(73) Assignee: ABB Technology AG, Zurich (CH)

( * ) Notice: Subject to any disclaimer, the term of this patent is extended or adjusted under 35 U.S.C. 154(b) by 556 days.

(21) Appl. No.: 12/125,574

(22) Filed: May 22, 2008

Related U.S. Application Data

(60) Provisional application No. 60/941,328, filed on Jun. 1, 2007.

(51) Int. Cl.

| | |
|---|---|
| ***G06F 11/30*** | (2006.01) |
| ***H01H 47/00*** | (2006.01) |
| ***H02H 3/00*** | (2006.01) |
| ***G01R 31/02*** | (2006.01) |

(52) U.S. Cl. ............. 702/182; 307/126; 361/3; 324/424

(58) Field of Classification Search .................. 702/182, 702/33, 44, 57, 60, 64–67, 70–71, 180, 187–189; 700/9, 12, 14, 21–22, 275, 286, 292, 295, 700/297–298; 324/415–416, 422–424; 361/1, 361/3; 340/657, 660, 691.6–691.8, 693.1; 307/112, 125–126, 137
See application file for complete search history.

(56) References Cited

OTHER PUBLICATIONS

Thomas, R., Controlled Switching of High Voltage SF6 Circuit Breakers for Fault Interruption, 2004, Thesis for the Engineering Degree, Department of Electric Power Engineering, Chalmers University of Technology, Goteborg, Sweden, 259 pp.*

* cited by examiner

*Primary Examiner* — Michael P Nghiem
*Assistant Examiner* — Toan M Le
(74) *Attorney, Agent, or Firm* — Michael M. Rickin; Michael C. Prewitt

(57) ABSTRACT

A method and an apparatus for showing data representative of the accuracy of switching operations executed by a high-voltage switchgear which is operatively coupled to a power line and to a synchronous switching device. Data related to switching operations executed by the high-voltage switchgear is recorded and then, based on the recorded data, values indicative of the accuracy of the switching operations executed with respect to predefined target switching operations are calculated. A histogram is formed using the calculated values and shown to a user.

8 Claims, 2 Drawing Sheets

METHOD AND APPARATUS FOR SHOWING DATA REPRESENTATIVE OF THE ACCURACY OF OPERATIONS OF A HIGH-VOLTAGE SWITCHGEAR

CROSS REFERENCE TO RELATED APPLICATIONS

This application claims the priority of U.S. provisional patent application Ser. No. 60/941,328 filed on Jun. 1, 2007, entitled "Method and Apparatus for Showing Data Representative of the Accuracy of Operations of a High-Voltage Switchgear" the contents of which are relied upon and incorporated herein by reference in their entirety, and the benefit of priority under 35 U.S.C. 119(e) is hereby claimed.

BACKGROUND OF THE INVENTION

This invention relates in general to the field of synchronous switching operations in power lines. In particular, the present invention relates to a method and an apparatus for showing data representative of the accuracy of switching operations executed by a high-voltage switchgear operatively coupled to a synchronous switching device.

As it is well known, power systems for transmitting and distributing electricity from power sources to various loads and users are equipped with several types of protecting switchgear, such as high-voltage circuit breakers. Such switchgear is typically adapted for intervening under determined operating conditions so as to ensure a proper functioning of an associated power line and of loads/users connected therewith.

Voltage and current transients generated during switching of high-voltage circuit breakers are of increasing concern for the electric utility industry. These concerns include both power quality issues for voltage-sensitive customer loads, and excessive stresses on power system equipment. Some proposed solutions for reducing switching transients include circuit breaker pre-insertion devices, such as resistors or inductors, and fixed devices such as arresters and current limiting reactors.

A solution finding increasing popularity is the so-called synchronous switching method, sometimes also referred to as the point-on-wave switching. Synchronous switching is performed by dedicated electronic devices, indicated in the art as synchronous switching devices, which control the operations of the associated switchgear. Upon receiving a close or a trip command, a synchronous switching device delays the energization of the switchgear control coils by a few milliseconds. In this way, the current inception in the case of a close command, or the contact separation in the case of an opening or trip command, is expected to ideally coincide with a certain point on the AC wave which is known to reduce switching transients. In applications, operations are considered synchronous with the AC wave when the current inception or the separation of the contacts occurs within a narrow window around the desired point on the AC wave. For synchronous closing, this point is often the voltage zero crossing. Applications where it is beneficial to close the contacts on or near the voltage zero crossing include the energizing of capacitor banks and energizing of unloaded lines or cables. Synchronous opening can be employed for shunt reactors de-energizing as an example.

Synchronous switching devices are usually located in high-voltage or medium-voltage substations and are provided with a software which allows the communication with a user, for instance for receiving device specific data, displaying this data, composing device settings and sending these settings to the device. This software is usually referred to as user-interface software. In some cases, the software that allows the communication between the synchronous switching device and the user may be different from the software that presents the downloaded data.

For synchronous switching operations, on the user side, a corresponding user-interface software enables the user to receive records of synchronous operations, log entries, alarm status et cetera, from the synchronous switching device, and also displays this data in a user-friendly manner. The software also supports the user in selecting the synchronous switching device settings and can send the new settings to the device itself.

Clearly, users need to analyze the data in order to properly evaluate the performance of their equipment, and especially the accuracy of switching operations executed with respect to the desired synchronous or point-on wave switching operations. In other words, users wish to know how accurately the combination of a synchronous switching device and the associated switchgear was able to hit the targeted point-on-wave—not just for the most recent operation but also for as many operations as records are available.

Traditionally, user-interface software used with synchronous switching devices show data only in a numerical form. This makes it difficult for the user to grasp how accurately the synchronous switching device and the associated switchgear are performing on a statistical basis, and therefore to adopt appropriate corrective measures when needed.

Therefore, it would be desirable to provide a solution which allows the presentation to a user of a more accurate and complete picture regarding synchronous performance of a high-voltage switchgear, such as a high-voltage circuit breaker. This solution is provided by the method and apparatus according to the present invention.

SUMMARY OF THE INVENTION

A power system comprising:

a high voltage switchgear operatively connected to a power line, said high-voltage switchgear comprising two associated contacts which can be switched between a first position where they are coupled and a second position where they are separated;

a switching device which is operatively coupled to said high-voltage switchgear for switching said contacts between said first and second positions substantially synchronously with said power line, wherein said switching device comprises a first computer device having code therein configured to:

record data related to switching operations executed by said high-voltage switchgear;

based on the recorded data, calculate values, $E_{elect}$, indicative of the accuracy of the switching operations executed with respect to predefined target switching operations using the equation:

$$E_{elect}=t_{feedback}-t_{target}$$

where $t_{feedback}$ is a value indicative of the time occurred for the executed switching operation and $t_{target}$ is a predefined target time for said executed switching operation;

a second computer device in operative communication with said first computer device, said second computer device having code therein configured to:

form a histogram using said calculated values; and show the formed histogram to a user.

BRIEF DESCRIPTION OF THE DRAWINGS

The features, aspects, and advantages of the present invention will become better understood with regard to the following description, appended claims, and accompanying drawings where:

DETAILED DESCRIPTION OF ILLUSTRATIVE EMBODIMENTS

Figure 1:
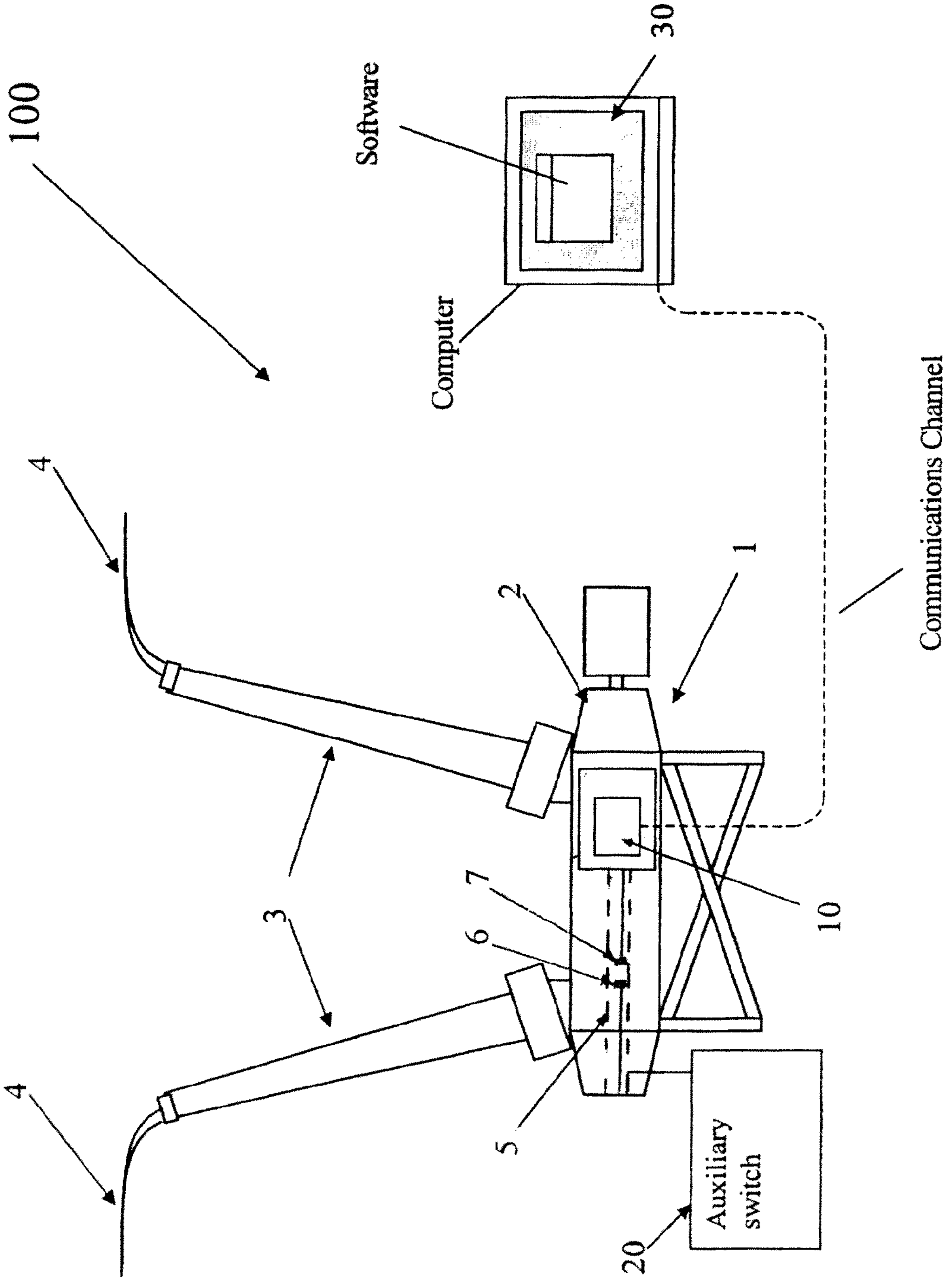
FIG. 1 is a view schematically illustrating a power system according to the present invention.

It should be noted that in the detailed description that follows, identical components have the same reference numerals, regardless of whether they are shown in different embodiments of the present invention. It should also be noted that in order to clearly and concisely disclose the present invention, the drawings may not necessarily be to scale and certain features of the invention may be shown in some what schematic form.

FIG. 1 schematically illustrates a power system according to the present invention which is indicated by the overall reference number 100. The power system 100 comprises a high-voltage switchgear 1 an exemplary embodiment of which is shown in FIG. 1. In the embodiment illustrated, the switchgear 1 comprises a casing 2 which is connected to two bushings 3 housing electrical terminal for input/output connections with a power line 4. Inside the casing 2 there is positioned a high-voltage interrupter 5 which comprises a pair of separable arcing contacts 6-7. As well known in the art, during switching operations of the switchgear 1, i.e. opening/closing maneuvers, the contacts 6-7 are switched between a first position where they are coupled to each other and a second position where they are instead separated. Those skilled in the art would appreciate that other types of high-voltage switchgear other than that illustrated in FIG. 1 can be suitably used.

The power system 100 according to the present invention further comprises a synchronous switching device 10 which is operatively coupled to the high-voltage switchgear 1. The switching device 10 is an electronic device having a computer device, e.g. a microprocessor, which comprises a dedicated software code stored therein. This software code is adapted for example to allow outputting command signals to the actuating means so that switching operations of the arcing contacts 6-7 between the first position and the second position are realized substantially synchronously with the AC wave of the associated power line 4. The computer device comprises also software code adapted for interfacing with a user for the purpose which will be described hereinafter. An example of a suitable synchronous switching device 10 which can be used in the switchgear 1 is the ABB Switching Control Sentinel (SCS), or the ABB Synchronous Control Unit (SCU). However, it would be appreciated by those skilled in the art that any other suitable synchronous switching device available on the market can be used.

The switchgear 100 comprises an auxiliary switch which is schematically illustrated in FIG. 1 by the reference number 20. The auxiliary switch 20 comprises a pair of auxiliary contacts which are operatively connected to the switchgear contacts 6-7. In particular, according to solutions well known in the art and therefore not described herein in detail, when the synchronous switching device 10 outputs an opening command or a closing command for the switchgear 1, the separation or coupling of the contacts 6-7 results also in the separation or coupling of the auxiliary contacts, respectively. An example of a suitable auxiliary switch 20 is the auxiliary switch Ruhrtal GPFX730166P001.

The power system 100 comprises also a second computer device 30, such as a laptop computer as illustrated in the embodiment of FIG. 1. The second computer device 30 is also provided with software code stored therein and is in operative communication with the computer device of the synchronous switching device 10 by using any suitable communication channel either wired or wireless, such as RS232, Ethernet, etc. In practice, the computer device 30 with the software stored and running therein constitutes an interface for a user communicating with the synchronous switching device 10. It would be appreciated by those skilled in the art that any other suitable computer device can be used instead of the illustrated laptop 30.

In the apparatus and method according to the invention, data related to switching operations executed by the high-voltage switchgear 1 is recorded by the synchronous switching device 10 at step 101. At step 102, on the basis of the recorded data, the synchronous switching device 10 calculates values which are indicative of the accuracy of the switching operations executed with respect to predefined target switching operations. The predefined target operations are operations executed substantially synchronously with the AC wave of the power line 4, i.e. opening or closing operations occur on the predefined target point-on wave or within a narrow window around the predefined target point-on wave. The width of such a window is selected according to the various applications.

More in detail, when either an opening or closing switching operation is executed by the switchgear 1, signals representative of the waveform of the power line 4 are recorded at step 101 and then, the synchronous switching device 10 determines from the recorded signals a corresponding value indicative of the time occurred for the executed switching operation. At step 102 the synchronous switching device 10 calculates the difference between the previously determined value indicative of the time occurred for the executed switching operation and a predefined target time for the executed switching operation. Each of the values calculated can be stored in a storing unit, such as for example a memory of the device 10 itself.

In one exemplary embodiment of the method according to the invention, the targeting accuracy is quantified by using the time difference between the current inception and the targeted point-on-wave in case of a synchronous closing. For a synchronous opening, the time difference between the separation time of the arcing contacts 6-7 and the targeted point-on-wave is used. Hence, the time of current inception and the separation time of the arcing contacts 6-7 are the values indicative of the time occurred for the executed switching operations. Such time values can be determined according to various alternative solutions readily known to those skilled in the art and therefore not described in detail herein.

This measure of accuracy can be referred as the electrical error:

$$E_{elect}=t_{feedback}-t_{target}$$

where $E_{elect}$ is the electrical error, $t_{feedback}$ is the time of current inception (for synchronous closing) or of arcing contact separation (for synchronous opening), and $t_{target}$ is the targeted point-on-wave. Hereby, as it happens for many synchronous applications, the targeted point-on-wave is a voltage zero crossing for closing synchronous switching operations. In these cases, the electrical error indicates the time difference between the zero crossing and the current inception. For opening synchronous switching operations, the targeted point-on-wave is a point on the current wave chosen to minimize the probability of unwanted restrikes or reignitions, for instance two milliseconds after a zero crossing. In these cases, the electrical error indicates the time difference between the targeted point-on-wave and the separation time of the arcing contacts.

Clearly, the above defined electrical error is one example of how to quantify the targeting accuracy of a synchronous switching device and the associated switchgear. However, other alternative ways can be implemented.

The calculated values are downloaded by the second computer device 30 from the first computer device of the synchronous switching device 10.

Figure 2:
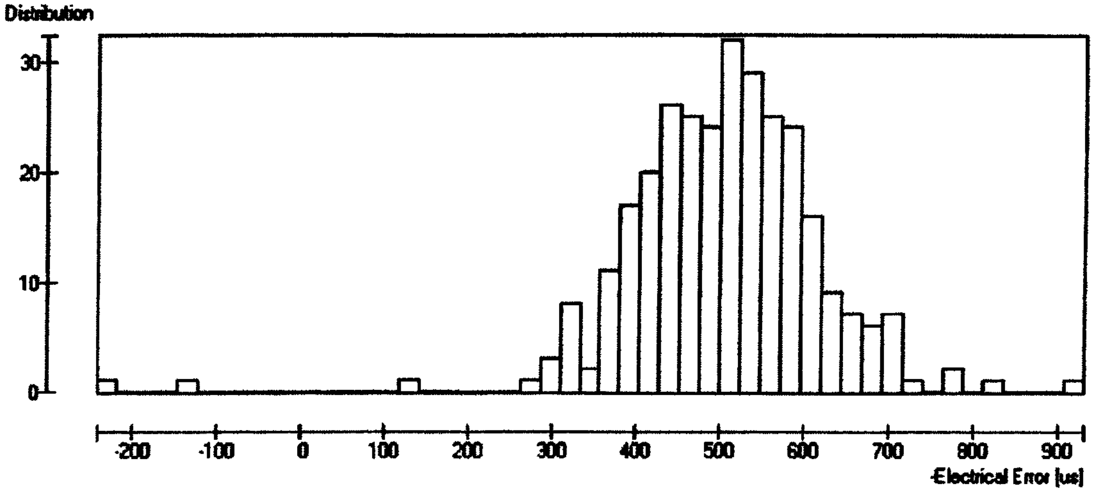
FIG. 2 shows an exemplary histogram formed by according to the method and system of the present invention.
Figure 3:
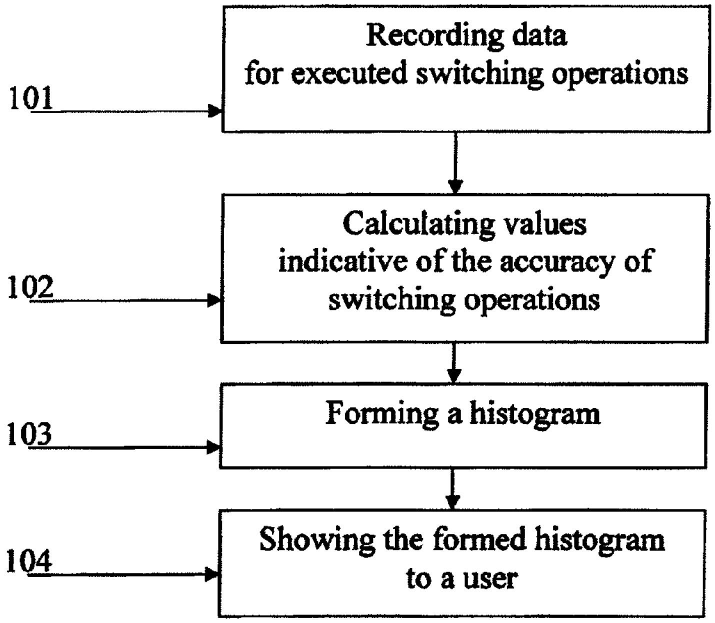
FIG. 3 is a flow chart illustrating a method for showing data representative of the accuracy of switching operations executed by a high-voltage switchgear operatively coupled to a synchronous switching device, in accordance to the present invention.

At step 103, the second computer device 10 forms a histogram using the downloaded calculated values. In particular, at step 103 the computer device 30 defines for the calculated values a range of values to be used for forming the histogram, i.e. the minimum and maximum values are determined. The defined range of values is divided into n bins, wherein n is selected on the basis of the total number of calculated values. In particular, n is equal to (total−number calculated values)/(k), where k is for instance equal to five. The number k represents the average number of values for each bin and is chosen based on preference by the user. Greater values yield coarse looking histograms, while smaller values yield histograms with finer granularity but with the occasional empty bin. Finally, the number of values that fall within each bin are counted and displayed as a bar graph, with the various bar graphs forming the histogram which is shown to a user, e.g. displayed on the video of the laptop 30. FIG. 2 shows an example of a histogram according to the method and system of the present invention formed by using electrical error values. In this example the targeted point-on-wave is 500 μs after a voltage zero crossing.

The use of histograms allows the visual representation of a large set of values that exhibit some sort of statistical distributions. From the histogram shown, a user can evaluate in a more accurate way if synchronous operations are properly performed for as many operations as records are available and not only for the most recent ones. Users can also identify the percentage of operations executed where the equipment used hit the target within a narrow time window and also benchmark the performance of different installations/equipment. This analysis evidences also whether interventions on the equipment used are necessary due to a non-satisfying accuracy in operations.

It is to be understood that the description of the foregoing exemplary embodiment(s) is (are) intended to be only illustrative, rather than exhaustive, of the present invention. Those of ordinary skill will be able to make certain additions, deletions, and/or modifications to the embodiment(s) of the disclosed subject matter without departing from the spirit of the invention or its scope, as defined by the appended claims.

What is claimed is:

1. A power system comprising:

a high voltage switchgear operatively connected to a power line, said high-voltage switchgear comprising two associated contacts which can be switched between a first position where they are coupled and a second position where they are separated;

a switching device which is operatively coupled to said high-voltage switchgear for switching said contacts between said first and second positions substantially synchronously with said power line, wherein said switching device comprises a first computer device having code therein configured to:

record data related to switching operations executed by said high-voltage switchgear;

based on the recorded data, calculate values, $E_{elect}$, indicative of the accuracy of the switching operations executed with respect to predefined target switching operations using the equation:

$$E_{elect}=t_{feedback}-t_{target}$$

where $t_{feedback}$ is a value indicative of the time occurred for the executed switching operation and $t_{target}$ is a predefined target time for said executed switching operation;

a second computer device in operative communication with said first computer device, said second computer device having code therein configured to:

form a histogram using said calculated values; and show the formed histogram to a user.

2. The power system of claim 1, wherein said second computer device further comprises code configured to download said calculated values from said first computer device.

3. The power system of claim 1, wherein said second computer device further comprises code configured to define for said calculated values a range of values to be used for forming the histogram.

4. The power system of claim 3, wherein said first computer device further comprises therein code configured to:

record signals representative of the waveform of said power line upon occurrence of a switching operation; and determine from said recorded signals, a corresponding value indicative of $t_{feedback}$.

5. The power system of claim 4, wherein said first computer device further comprises therein code configured to:

calculate the difference between $t_{feedback}$ and $t_{target}$.

6. The power system of claim 1, wherein said second computer device further comprises code configured to divide the defined range of values into n bins, wherein n is selected on the basis of the total number of calculated values.

7. The power system of claim 1 wherein said executed switching operation is synchronous closing of said contacts and $t_{feedback}$ is the time of current inception.

8. The power system of claim 1 wherein said executed switching operation is synchronous opening of said contacts and $t_{feedback}$ is the time of contact separation.

* * * * *